(12) United States Patent
Hattori et al.

(10) Patent No.: US 7,710,114 B2
(45) Date of Patent: May 4, 2010

(54) APPARATUS FOR PRODUCING NUCLEAR SPIN-POLARIZED NOBLE GAS, NUCLEAR MAGNETIC RESONANCE SPECTROMETER, AND NUCLEAR MAGNETIC RESONANCE IMAGER

(75) Inventors: Mineyuki Hattori, Ibaraki (JP); Takashi Hiraga, Osaka (JP); Noritaka Yamamoto, Osaka (JP)

(73) Assignee: National Institute of Advanced Industrial Science and Technology, Tokyo (JP)

( * ) Notice: Subject to any disclaimer, the term of this patent is extended or adjusted under 35 U.S.C. 154(b) by 362 days.

(21) Appl. No.: 11/984,869

(22) Filed: Nov. 23, 2007

(65) Prior Publication Data

US 2008/0128602 A1 Jun. 5, 2008

(30) Foreign Application Priority Data

Nov. 24, 2006 (JP) ............................. 2006-316485

(51) Int. Cl.
*G01V 3/00* (2006.01)

(52) U.S. Cl. ...................................... 324/304; 324/300

(58) Field of Classification Search ......... 324/300–322; 600/407–445; 62/49.1, 3.1, 55.5, 919, 925; 335/301; 417/313

See application file for complete search history.

(56) References Cited

U.S. PATENT DOCUMENTS 6,423,387 B1 * 7/2002 Zollinger et al. ........... 428/35.2
6,543,236 B2 * 4/2003 Zollinger et al. ............... 62/3.1
7,287,390 B2 * 10/2007 Bolam ........................ 62/55.5
7,382,124 B2 * 6/2008 Hattori et al. ................ 324/304
7,541,051 B2 * 6/2009 Hattori et al. ................ 424/600
2005/0084450 A1   4/2005 Hattori et al.
2006/0083789 A1   4/2006 Ohtake et al.
2006/0263300 A1   11/2006 Hattori et al.

FOREIGN PATENT DOCUMENTS

JP        2003-245263        9/2003

* cited by examiner

*Primary Examiner*—Brij B Shrivastav
(74) *Attorney, Agent, or Firm*—Wenderoth, Lind & Ponack, L.L.P.

(57) ABSTRACT

An apparatus for producing a nuclear spin-polarized noble gas by spin-polarizing a noble gas in the presence of an optical pumping catalyst under application of magnetic field and laser light, including a cell having a thin reaction chamber, a gas introduction conduit connected in fluid communication with the reaction chamber for feeding the noble gas, a gas discharge conduit connected in fluid communication with the reaction chamber, a first gate valve having an outlet port connected to the gas introduction conduit and an inlet port adapted to be in fluid communication with a noble gas introduction line, a second gate valve having an inlet port connected to the gas discharge conduit and an outlet port, and a capillary tube removably connected to the outlet port of the second valve for recovering a nuclear spin-polarized noble gas produced in the reaction chamber. The apparatus may be directly connected to NMR or MRI.

16 Claims, 4 Drawing Sheets

APPARATUS FOR PRODUCING NUCLEAR SPIN-POLARIZED NOBLE GAS, NUCLEAR MAGNETIC RESONANCE SPECTROMETER, AND NUCLEAR MAGNETIC RESONANCE IMAGER

CROSS-REFERENCE TO RELATED APPLICATION

This application claims, under 35 USC 119, priority of Japanese Patent Application No. 2006-316485, filed Nov. 24, 2006, disclosures of which, inclusive of the specification, claims and drawings, are hereby incorporated by reference herein.

BACKGROUND OF THE INVENTION

Field of the Invention

The present invention relates to an apparatus for producing a nuclear spin-polarized noble gas, and to a nuclear magnetic resonance spectrometer and a nuclear magnetic resonance imager connected to the apparatus for using a nuclear spin-polarized noble gas produced therein.

Gases at atmospheric pressure, which have a lower atomic density than liquids and solids, had not been used until recently as targets in nuclear magnetic resonance spectroscopy (NMR) or magnetic resonance imaging (MRI).

However, when a noble gas composed of monatomic molecules having a nuclear spin with a spin quantum number of ½ such as the xenon isotope having a mass number of 129 ($^{129}$Xe) or the helium isotope having a mass number of 3 ($^{3}$He) is irradiated with a circularly-polarized laser in the presence of vapor of an alkali metal such as rubidium (Rb) or cesium (Cs) to excite the electron spin system (a process called "optical pumping"), the spin system of the noble gas can be polarized (hyperpolarization).

It was reported that the NMR signal intensity can be enhanced by tens of thousands of times by this method, enabling NMR signals to be obtained which are more than 100 times stronger than those which can be obtained when the same volume of water is used. This report has drawn attention to NMR/MRI techniques that use a nuclear spin-polarized noble gas (see JP-A-2003-245263, for example).

Here, the term "hyperpolarization" signifies that the distribution in the spin numbers which occupy the nuclear spin energy level of an atomic nucleus corresponding to the orientation state with respect to a main static magnetic field is extremely polarized as compared to the distribution under a state of thermal equilibrium (the Boltzmann distribution).

The process of forming a polarized noble gas is generally called "optical pumping" and works as follows. When an electron at the ground state level of rubidium, for example, is excited by light absorption to an excited state level and then returns to the ground state level, it transits with high probability to one of the electron levels of the rubidium ground state levels of which the degeneracy has been magnetically broken by an externally applied magnetic field, thereby creating a state of high electron spin polarization in the rubidium molecules. When this rubidium having a highly polarized state collides with a noble gas such as xenon, the highly polarized state of rubidium is transferred to the nuclear spin system of the noble gas such as xenon, resulting in a polarized noble gas.

Specifically, the nuclear spin energy levels of $^{129}$Xe are splited and an unequal distribution in the number of occupied spin (difference in the number of occupied spin) are built by optical pumping. The magnetic field which is externally applied at the time of such optical pumping is a low magnetic field of about $10^{-2}$ T (tesla) (100 gauss). This polarized $^{129}$Xe, instead of being used to carry out measurement in this state, is introduced into a nuclear magnetic resonance spectrometer or a nuclear magnetic resonance imager at an even higher magnetic field of about 0.3 T. Then, the resonance frequency between two energy levels can be increased with the difference in the number of occupied spin maintained, enabling the NMR detection sensitivity to be enhanced.

In an NMR/MRI process which uses a nuclear spin-polarized noble gas, unlike an ordinary prior-art NMR/MRI process, measurement does not necessarily involve the averaging of NMR signals. Therefore, because the NMR signals are measured only once, it is desirable to supply the nuclear spin-polarized noble gas generated by optical pumping in a nuclear spin-polarized noble gas generating cell to the nuclear magnetic resonance spectrometer or a nuclear magnetic resonance imager in a state in which the difference in the number of occupied spin is maintained.

As methods for producing a nuclear spin-polarized noble gas, various methods, including a method in which a noble gas is converted into a nuclear spin-polarized noble gas in a stagnant condition, that is, a batch method, and a method in which continuous conversion of a noble gas into a nuclear spin-polarized noble gas is carried out in a flow cell, have been proposed.

However, the conventional methods all suffer from poor polarized noble gas production efficiency and poor polarized noble gas use efficiency. The present inventors, therefore, have proposed the apparatuses described below.

(1) An apparatus for producing a nuclear spin-polarized noble gas having a means for heating a glass cell in which solid rubidium and solid xenon have been charged in an oxygen-free atmosphere under reduced pressure to achieve gaseous xenon and a gas-liquid mixture of rubidium, a means for applying a magnetic field to the glass cell and irradiating laser light onto the glass cell, a means for introducing xenon gas while discharging generated nuclear spin polarized xenon gas, and a pressure control means for preventing a pressure drop during the above process (U.S. Patent Application Publication No. 20060083789).

(2) An apparatus for producing a nuclear spin-polarized noble gas having a flat flow cell having flat surfaces opposed to each other with a gap therebetween and a sufficient irradiation area to enable the optical power density of irradiated laser light fully effective. A mixed gas of a noble gas and an optical pumping catalyst is allowed to flow through the gap in one direction, an excitation light is irradiated into the flow cell, and a magnetic field is applied such that the lines of magnetic force pass through the flow cell in a direction perpendicular to a surface in the flow cell onto which the excitation light is irradiated (U.S. Patent Application Publication No. 20050084450).

In a conventional batch type apparatus, xenon is diluted to, for example, about helium 2% xenon concentration and polarized, a gas containing the generated xenon is frozen with liquid nitrogen, and the frozen gas is heated to extract only xenon to produce a high-concentration xenon gas. Therefore, the work efficiency is extremely poor. In a conventional apparatus in which a gas is polarized in a stagnant condition, the polarized noble gas cannot be generated continuously, and the polarized gas must be carried to an NMR apparatus or the like in a separate vessel. Therefore, a considerable time and effort is required and the polarization rate may decrease during that time. The new apparatus (1) can overcome the problems and continuously produce a high-concentration polarized xenon gas without a freezing process.

The problem to be solved by the apparatus (2) proposed by the present inventors is to improve the shape of the flow cell and the excitation light source to obtain an apparatus for producing a polarized noble gas in which gases can be allowed to flow safely to produce a polarized noble gas with a higher polarization rate continuously and a method for producing a noble gas with a higher polarization rate using the apparatus. This invention also enables an NMR/MRI measurement to be made in a short period of time without causing a decrease in the polarization rate after the continuous production of the polarized noble gas by the improved apparatus and method. With this apparatus, an NMR/MRI measurement on a very micro region can be made in a short period of time with high detection sensitivity.

SUMMARY OF THE INVENTION

The phenomenon in which the difference in the number of occupied spin of a nuclear spin-polarized noble gas decreases and becomes close to the Boltzmann distribution is called "spin relaxation." The spin relaxation is undesirable because when it occurs, the NMR signal intensity decreases. The main cause of spin relaxation is considered to be distortion of electron cloud in the nuclear spin-polarized noble gas due to collisions of it with inner walls of the cell and the pipes. To provide an apparatus for producing a nuclear spin-polarized noble gas which can prevent occurrence of spin relaxation and which allows the nuclear spin-polarized noble gas to be supplied over a long distance without causing a decrease in the NMR signal intensity, and a nuclear magnetic resonance spectrometer and a nuclear magnetic resonance imager in which the apparatus for producing a nuclear spin-polarized noble gas is incorporated and which uses the nuclear spin-polarized noble gas therefrom, the present inventors have found it effective to provide a nuclear spin-polarized noble gas generating cell in which a noble gas is subjected to optical pumping in the presence of an alkali metal to generate a nuclear spin-polarized noble gas, and an extra fine capillary tube having an inside diameter 0.1 to 1.25 mm downstream of the polarized noble gas generating cell, and proposed a new apparatus in U.S. Patent Application Publication No. 20060263300 entire disclosure of which is hereby incorporated by reference herein.

As described above, the apparatuses and methods proposed by the present inventors have excellent features and have beneficial effects. However, there still remains room for improvement in terms of providing a system which has advantages of both a batch method and a flow cell method, which is easy to produce, assemble and maintain, and which can provide high polarized noble gas production efficiency and high polarized noble gas use efficiency.

It is, therefore, an object of the present invention to provide a new apparatus for producing a nuclear spin-polarized noble gas which can overcome the above problems and to utilize the apparatus in a nuclear magnetic resonance spectrometer or a nuclear magnetic resonance imager.

In accordance with a first aspect of the present invention there is provided an apparatus for producing a nuclear spin-polarized noble gas by spin-polarizing a noble gas in the presence of an optical pumping catalyst, comprising:

a cell comprising first and second surface members spaced apart from each other to define a reaction chamber therebetween, one of the first and second surface members being configured to allow laser light to pass therethrough into said reaction chamber, a gas introduction conduit connected in fluid communication with said reaction chamber for feeding the noble gas therethrough to said reaction chamber, a gas discharge conduit connected in fluid communication with said reaction chamber, a system for applying a magnetic field to said reaction chamber, a system for delivering laser light to said reaction chamber through one of said first and second surface members that is configured to allow laser light to pass therethrough into said reaction chamber, a noble gas introduction line for feeding the noble gas, a first valve having an outlet port connected to said gas introduction conduit and an inlet port adapted to be in fluid communication with the noble gas introduction line, a second valve having an inlet port connected to said gas discharge conduit and an outlet port, and a capillary tube removably connected to said outlet port of said second valve for recovering a nuclear spin-polarized noble gas produced in said reaction chamber.

According to the present invention, it is possible to further develop the apparatuses for producing a polarized noble gas with remarkable features and effects proposed by the present inventors and to construct a system which has advantages of both a batch method and a flow cell method, which is easy to produce, assemble and maintain, and which can provide high polarized noble gas production efficiency and high polarized noble gas use efficiency.

In another aspect, the present invention provides a nuclear magnetic resonance spectrometer connected to the above apparatus for producing a nuclear spin-polarized noble gas and adapted for using a nuclear spin-polarized noble gas produced by the apparatus.

The present invention provides nuclear magnetic resonance imager connected to the above apparatus for producing a nuclear spin-polarized noble gas and adapted for using a nuclear spin-polarized noble gas generated by the apparatus.

The present invention further provides an apparatus for producing a nuclear spin-polarized noble gas, comprising:

a flat cell including flat plates opposed to each other with a gap in which a noble gas is spin polarized in the presence of an optical pumping catalyst, a laser beam delivering system for applying a laser beam as an excitation light into said gap, a magnetic field applying system for applying a magnetic field such that the lines of magnetic force pass through said flat plates into said gap in a direction perpendicular or generally perpendicular thereto, a device for controlling the temperature of said flat cell, and an extra fine capillary tube, wherein at least one of said flat plates of said flat cell is configured to allow laser light to pass therethrough into said gap, wherein said flat cell is provided with a gas introduction conduit for introducing a noble gas, and a discharge conduit for discharging generated nuclear spin-polarized noble gas, wherein the introduction and cut-off of the noble gas to said gas introduction conduit are controlled by a first valve having such a structure that an outlet port thereof can be seen from an inlet port thereof when said valve is opened, wherein the discharge and cut-off of generated nuclear spin-polarized noble gas from said discharge conduit is controlled by a second valve having such a structure that an outlet port thereof can be seen from an inlet port thereof when said valve is opened, and wherein said extra fine capillary tube is detachably connected to said outlet of said second valve.

BRIEF DESCRIPTION OF THE DRAWINGS

Other objects, features and advantages of the present invention will become apparent from the detailed description of the preferred embodiments of the invention which follows, when considered in the light of the accompanying drawings, in which.

DETAILED DESCRIPTION OF THE PREFERRED EMBODIMENTS OF THE INVENTION

Figure 1:
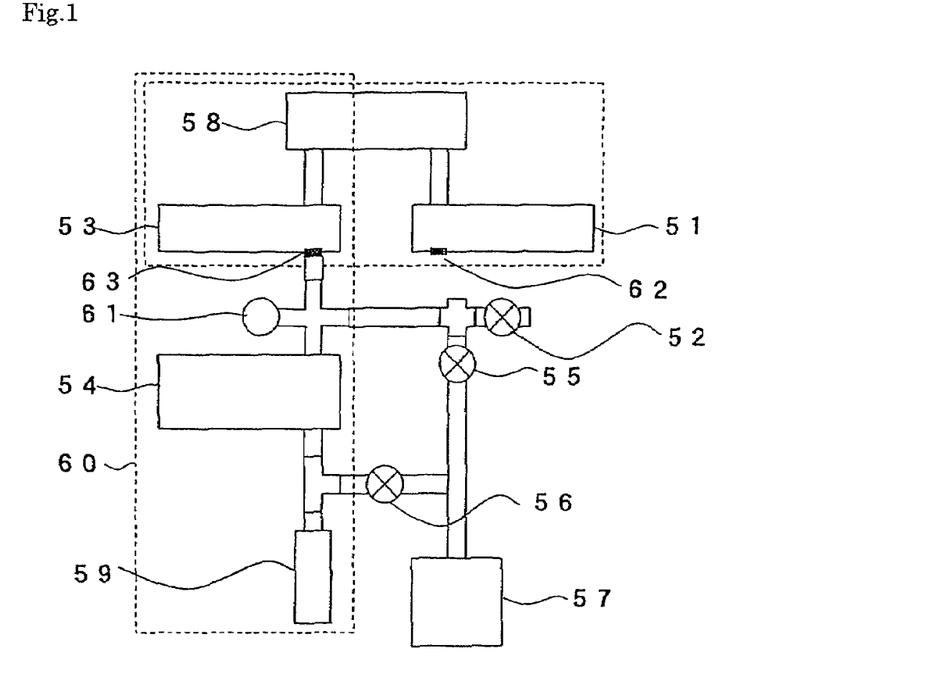
FIG. 1 is a structural block diagram illustrating an apparatus for producing a nuclear spin-polarized noble gas according to one embodiment of the present invention during transportation of an optical pumping catalyst into a cell.

Referring to FIG. 1 illustrating a state of an apparatus for producing a nuclear spin-polarized noble gas according to the present invention during transportation of an optical pumping catalyst into a cell 58. Designated as 53 is a first valve having an outlet port connected in fluid communication with an upstream side of the cell 58. A second valve 51 having an inlet port is connected in fluid communication with a downstream side of the cell 58. The first valve 53 has an inlet port connected, through an optical pumping catalyst supply line 73 and a valve 54, to a catalyst reservoir 59 containing the optical pumping catalyst. Designated as 57 is an ultrahigh vacuum evacuation system, as 60 is a heating device, as 61 is a vacuum gauge, as 62 is a separation mechanism and as 63 is a separation mechanism. Additional valves 52, 55 and 56 are also provided.

The optical pumping catalyst contained in the catalyst reservoir 59 is supplied to the cell 58 as follows. The valves 51 and 52 are closed while the valves 53, 54, 55 and 56 are opened. The cell 58, the optical pumping catalyst supply line 73 and the catalyst reservoir 59 are then evacuated with the vacuum evacuation system 57 to create a vacuum therein. The heating device 60 is then operated so that the catalyst in the catalyst reservoir 59 is transported into the cell 58 through the optical pumping catalyst supply line 73. The heating device 60 is then stopped to cool the catalyst to room temperature. Subsequently, the valves 54 and 55 are closed and the valve 52 is opened to introduce high-purity nitrogen gas. When it is determined by the vacuum gauge 61 that the pressure of the high-purity nitrogen gas has reached atmospheric pressure, the valves 52 and 53 are closed. A unit composed of the cell 58, the first and second valves 53 and 51 and their associated pipes is separated by the separation mechanisms 62 and 63 from a unit composed of the catalyst reservoir 59, the vacuum gauge 61, the vacuum evacuation system 57 and their associated valves and pipes including the optical pumping catalyst supply line 73.

As a consequence of the above procedure, the optical pumping catalyst such as rubidium (Rb) is introduced in a gaseous state into the cell 58, is cooled into a solid state, and deposits on an inside surface of the cell 58, preferably an inside surface of a flat plate transparent to laser light.

Figure 2:
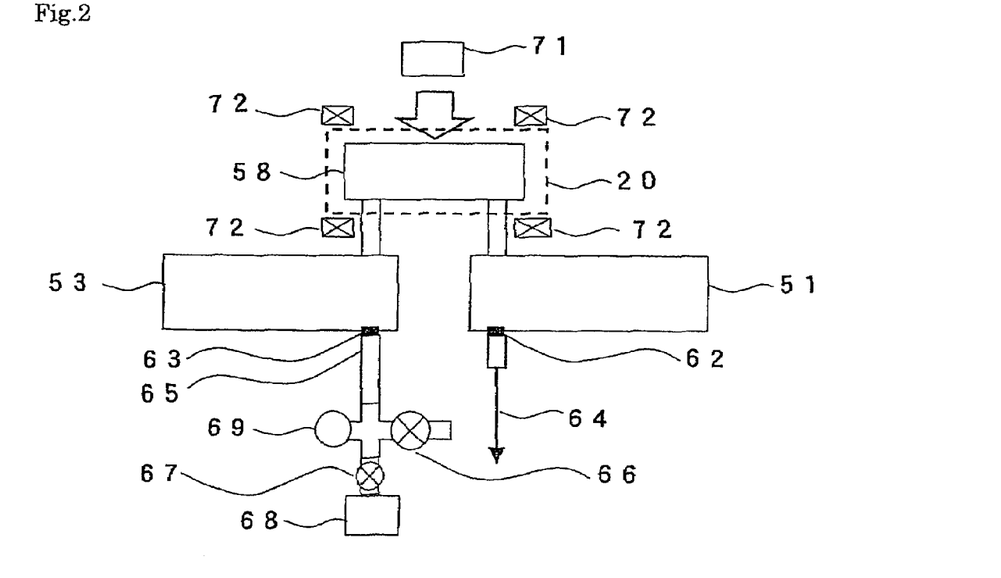
FIG. 2 is a structural block diagram illustrating the apparatus for producing a nuclear spin-polarized noble gas according to the present invention during production of a nuclear spin-polarized noble gas.

Then, a noble gas is introduced into the cell 58 to produce a nuclear spin-polarized noble gas. This process is carried out with the apparatus illustrated in FIG. 2. In this case, the unit composed of the cell 58, the first and second valves 53 and 51 and their associated pipes is connected by the separation mechanisms 62 and 63 to an extra fine capillary tube 64 and to a unit composed of an ultrahigh vacuum evacuation device 68, a vacuum gauge 69 and their associated valves 66 and 67 and pipes including a noble gas introduction line 65. In FIG. 2, designated as 70 is a heating device for heating the cell 58, as 71 a system for delivering laser light to the cell 58, and as 72 is a system for applying a magnetic field to the cell 58.

In operation, the second valve 51 is connected by the separation mechanism 62 to an extra fine capillary tube 64 while the first valve 53 is connected by the separation mechanism 63 to the noble gas introduction line 65. After the valve 66 is closed and the valve 67 is opened, the noble gas introduction line 65 is evacuated with the ultrahigh vacuum evacuation device 68 to create a vacuum therein. When it is determined by the vacuum gauge 69 that sufficient evacuation has been accomplished, the valve 67 is closed and the valve 66 is opened to introduce a high-purity noble gas. When it is determined by the vacuum gauge 69 that the pressure of the high-purity noble gas has reached atmospheric pressure, the first valve 53 is opened to introduce the noble gas into the cell 58. After heating the cell 58 with the heating device 70, laser light is emitted from the laser light application system 71. At the same time, a uniform magnetic field is applied to the cell 58 by the magnetic field application system 72, so that the noble gas is spin-polarized (hyperpolarized). When the second valve 51 is opened, a nuclear spin-polarized noble gas can be delivered through the extra fine capillary tube 64.

As can be understood from FIG. 1 and FIG. 2, in the apparatus of the present invention, the transportation of an optical pumping catalyst to the cell 58 and production of a nuclear spin-polarized noble gas by introducing a noble gas into the cell 58 can be easily switched as needed by the separation mechanisms 62 and 63 attached to the valves 51 and 53, respectively. Also, introduction and cut-off of a noble gas and delivery and cut-off of generated spin-polarized noble gas can be easily switched by the separation mechanisms 62 and 63 as needed.

The first and second valves 53 and 51 are each preferably has a structure such that the outlet port thereof can be seen from the inlet port thereof when the valve is opened. A gate valve is an illustrative of the suitable valve having such a structure.

Figure 3:
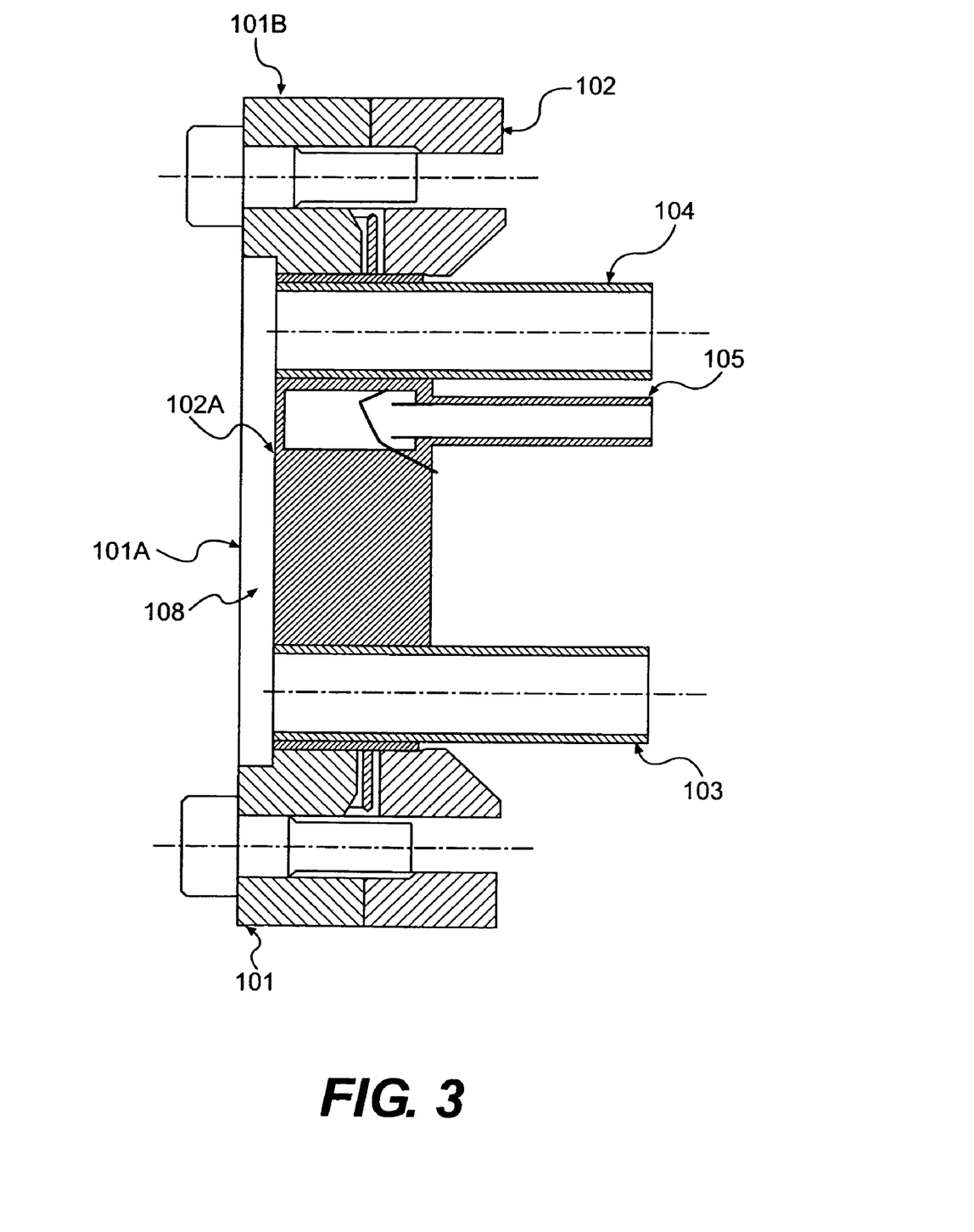
FIG. 3 is a cross-sectional schematic view illustrating an embodiment of a cell usable in the apparatus of FIG. 2.
Figure 4:
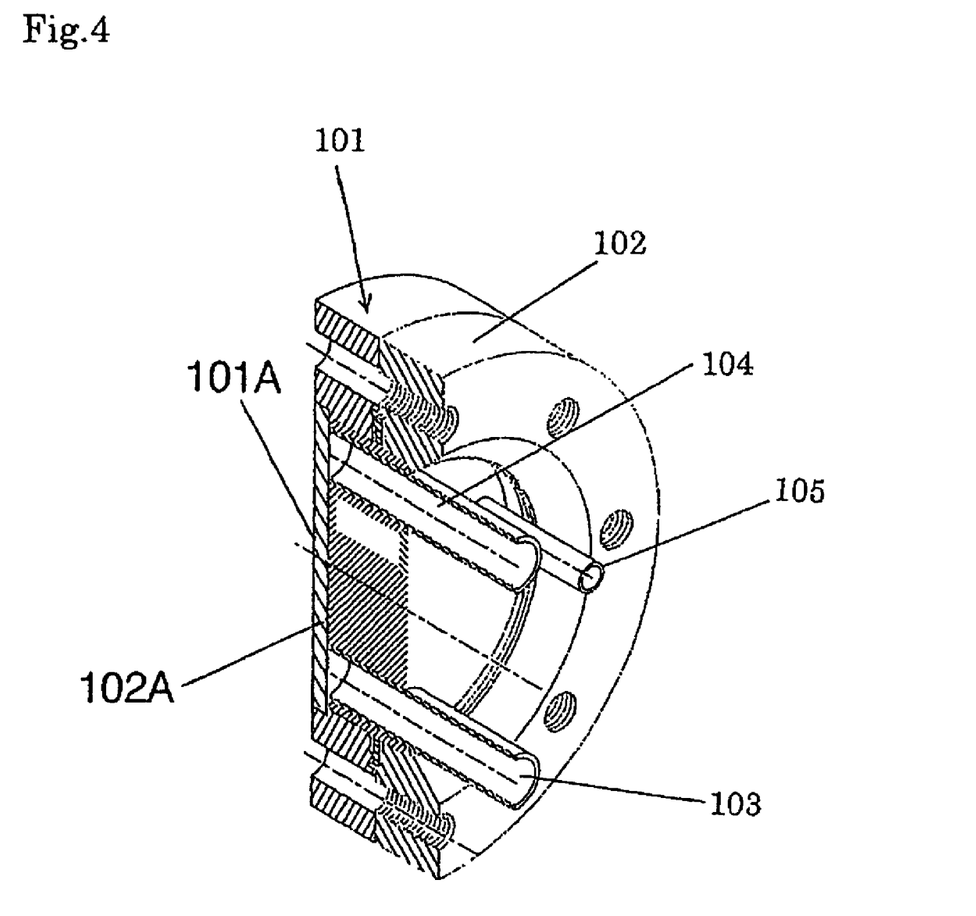
FIG. 4 is a cross-sectional perspective schematic view of the cell of FIG. 3.

One suitable example of the cell 58 is illustrated in FIG. 3 and FIG. 4. In this embodiment, the cell 58 is composed of a first section 101 having a first circular flat surface member 101A and a second section 102 having a second circular flat surface member 102A. The first surface member 101A is made of, for example, glass and supported by a ring-shaped support 101B. The first and second sections 101 and 102 are detachably integrated with each other by fixing bolts such that the first and second surface members 101A and 102A are spaced apart from each other to define therebetween a thin, preferably uniform gap 108 which serves as a reaction chamber. The second section 102 is provided with a gas introduction conduit 103, a gas discharge conduit 104, and a cooling mechanism 105. The cooling mechanism 105 is provided to prevent the optical pumping catalyst from flowing into the gas discharge conduit 104. The gas introduction conduit 103 is connected to outlet port of the first valve 53, and the gas discharge conduit 104 is connected to an inlet port of the second valve 51.

The first surface member 101A is preferably a flat plate made of a material, such as glass, preferably a quartz glass, which is transparent to laser light. Alternately, the first surface member 101A may be a flat plate having one or more windows each of which is transparent to laser light. The second surface member 102A is generally made of a metal. The first and second surface members 101A and 102A preferably have flat surfaces preferably disposed in parallel with each other and spaced apart from each other a distance generally in the range of 0.3 to 2 mm, preferably in the range of 0.5 to 1 mm. Thus, the reaction chamber 108 defined between the first and second surface members 101A and 102A is a thin chamber in which the introduced noble gas is spin-polarized in the presence of the catalyst under application of magnetic field and laser light to produce a nuclear spin-polarized noble gas.

The individual parts constituting the cell 58 illustrated in FIG. 3 and FIG. 4 can be easily assembled or disassembled, and are easy to reuse and maintain. In addition, the reaction for producing a polarized noble gas can be carried out in the cell 58 easily and stably with high efficiency.

Figure 5:
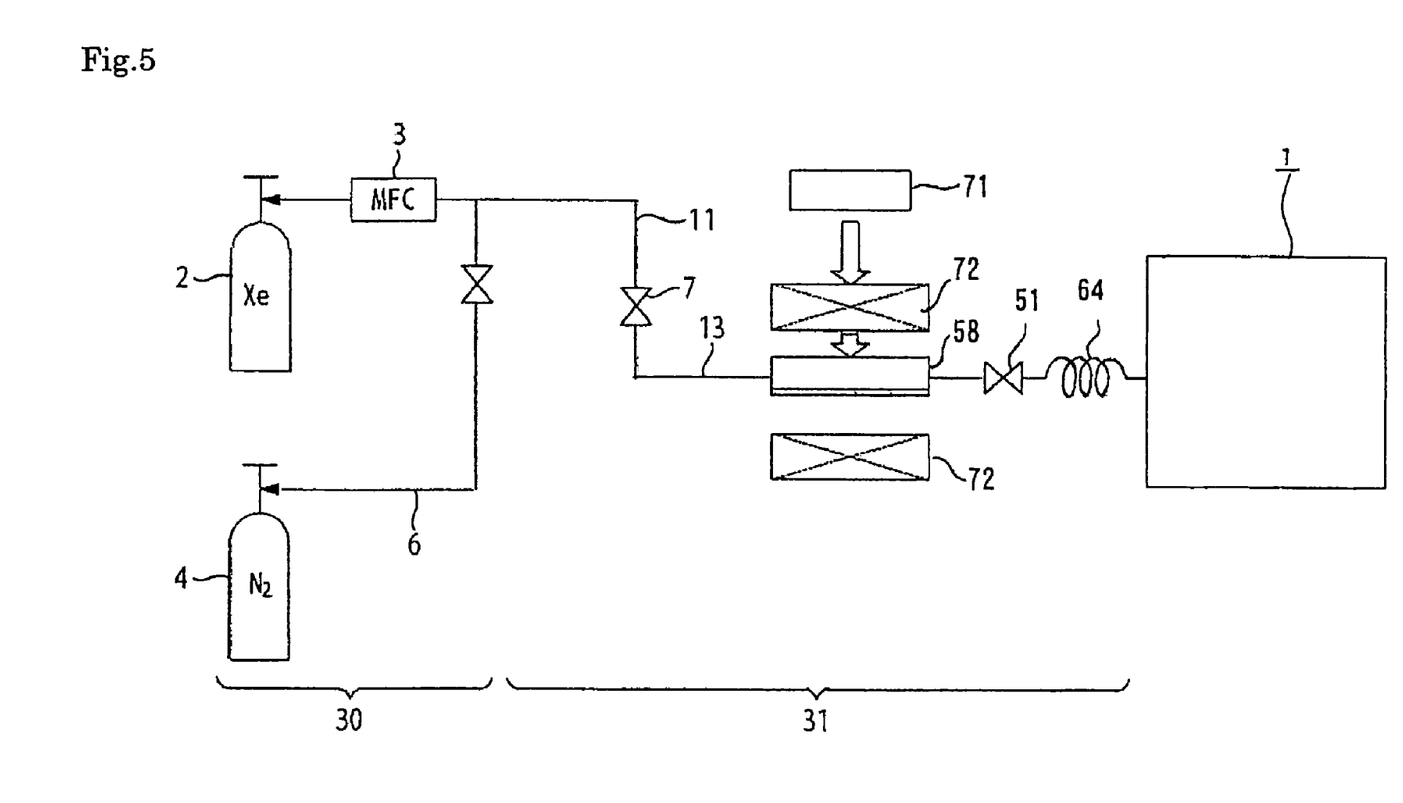
FIG. 5 is a block diagram illustrating the overall structure of the apparatus of FIG. 2.

Referring next to FIG. 5 illustrating the overall structure of the apparatus for producing a nuclear spin-polarized noble gas, designated generally as 30 is a noble gas supply section and as 31 is a spin-polarized noble gas producing section. A noble gas is supplied from a noble gas cylinder 2 to a cell 58 for production of a nuclear spin-polarized noble gas through a noble gas introduction line 65, a valve 53 and a gas introduction conduit 103 at a flow rate of generally 5 to 100 sccm, preferably 10 to 30 sccm, by a mass flow controller 3 connected to the noble gas cylinder 2.

A nitrogen gas cylinder 4 is connected to the noble gas introduction line 65 via a nitrogen gas supply line 6 so that the noble gas supply section 30 and the spin-polarized noble gas producing section 31 can be cleaned and purged with nitrogen gas.

The spin-polarized noble gas producing section 31 includes the cell 58, a magnetic field application system 72 having a plurality of optical pumping magnets, an laser light application system 71 and an extra fine capillary tube 64.

The noble gas supply section 30 is connected to upstream of the cell 58. The laser light application system 71 and the magnetic field application system 72 are located in the vicinity of the cell 58 so that laser light can be emitted onto the cell 58 and a magnetic field can be applied to the cell 58 to induce nuclear spin polarization of the noble gas.

The extra fine capillary tube 64 is connected to a nuclear magnetic resonance spectrometer 1 in the example shown in FIG. 5 so that the generated nuclear spin-polarized noble gas directed by the extra fine capillary tube 64 can be used immediately. A commercially available device tuned for a noble gas can be used as the nuclear magnetic resonance spectrometer 1. It is needless to say that the nuclear magnetic resonance spectrometer 1 may be replaced by a nuclear magnetic resonance imager.

In the apparatus of the present invention capable of forming a system as shown in FIG. 5, for example, the catalyst reservoir 59 shown in FIG. 1 is a stainless vessel in the shape of a circular or rectangular cylinder, and has a sufficient size to accommodate a glass ample encapsulating therein an alkali metal.

The extra fine capillary tube 64 is a tube having an inside diameter of 0.1 to 1.25 mm, preferably 0.2 to 0.8 mm, more preferably 0.25 to 0.53 mm, and a length of 1 to 22 m, preferably 3 to 10 m. The extra fine capillary tube 64 is preferably a single tube without a joint along its length for inhibition of spin relaxation.

The extra fine capillary tube 64, when having an inside diameter of 0.1 to 1.25 mm, is flexible enough not to snap when being bent and easy to handle since it does not easily crack or break on impact. In addition, the volume in the extra fine capillary tube 64 is smaller than that in a conventional large-diameter tube, the nuclear spin-polarized noble gas can be allowed to flow at a higher transfer rate per unit volume. As a result, collisions of the nuclear spin-polarized noble gas with the inner wall of the extra fine capillary tube 64 can be reduced and occurrence of spin relaxation can be reduced. Therefore, it is possible to supply the nuclear spin-polarized noble gas without lowering the NMR signal intensity over a distance of 1 to 22 m.

As the extra fine capillary tube 64, a commercially available capillary tube for gas chromatograph made of fused silica, glass, resin or the like can be used. Above all, fused silica is preferred from the standpoint of preventing occurrence of spin relaxation. Illustrative examples include untreated fused silica capillary tubes (inside diameter 0.53 mm, 0.25 mm) and inactivated fused silica capillary tubes (inside diameter 0.53 mm, 0.25 mm) manufactured by GL Science, Ltd.

As shown in FIG. 5, the optical pumping magnets of the magnetic field application system 72 are located above and below the cell 58. As the optical pumping magnets are arranged to sandwich the cell 58 from above and below, a magnetic field is applied toward the first and second surface members 101A and 102A of the cell 58 in a direction perpendicular or generally perpendicular to the direction in which the gas flows.

As the optical pumping magnets, Helmholts electromagnets or permanent magnets having an air-core structure so that light can pass through it is preferred. The magnetic field generated by the optical pumping magnets preferably has an intensity of about $0.2 \times 10^{-2}$ to $10 \times 10^{-2}$ T. Even with such a magnetic field with a low intensity, the noble gas can be sufficiently spin-polarized.

The laser light application system 71 is located on one side of the cell 58. For the laser light application system 71, a known lamp or laser can be used. Above all, a laser diode array is preferred since it has a high output and a narrow line width.

When the laser light application system 71 is located outside one of the optical pumping magnets as shown in FIG. 5, the optical pumping magnet must be optically transparent so that the light emitted from the laser light application system 71 can reach the cell 58 through the optical pumping magnet. In this case, the direction in which the lines of magnetic force pass through the cell 58 and the incident direction of the light emitted from the laser light application system 71 are generally the same.

While a nuclear magnetic resonance spectrometer having a single RF coil is used in this embodiment, a magnetic resonance imager having a plurality of coils to generate a gradient magnetic field may be used instead.

Since the nuclear spin-polarized noble gas is supplied through the extra fine capillary tube 64, occurrence of spin relaxation is suppressed and the nuclear spin-polarized noble gas can be supplied over a distance of 1 to 30 m. Therefore, the cell 58 and the nuclear magnetic resonance spectrometer 1 can be located apart from each other. As a result, the influence of leakage magnetic field from the nuclear magnetic resonance spectrometer 1 on the cell 58 can be decreased and the production of nuclear spin-polarized noble gas in the cell 58 can be increased, thus enabling the NMR signal intensity to be increased.

A method for producing a nuclear spin-polarized noble gas in the nuclear spin-polarized noble gas producing section 31 will be next described.

A noble gas as a raw material is a gas composed of monatomic molecules and having a nuclear spin. Among such gases, the xenon isotope ($^{129}$Xe) having a mass number of 129 and the helium isotope ($^{3}$He) having a mass number of 3, both of which has nuclear spins with a spin quantum number of ½, are preferred. Nuclear spin polarization can be also induced in gases having a nuclear spin with a spin quantum number of 3/2 or 5/2. However, such gases are not preferred since spin relaxation due to nuclear quadrupole moment occurs and a nuclear spin polarization state can be maintained for only a short period of time. In addition, $^{3}$He requires enrichment since its natural abundance ratio is 0.000138%. On the contrary, $^{129}$Xe can be used without enrichment since its natural abundance ratio is 26.44%. Therefore, in terms of costs and other reasons, the use of xenon gas is more preferred. For example, 100% xenon gas is used.

Illustrative examples of the alkali metal as an optical pumping agent include cesium (Cs), rubidium (Rb) and sodium (Na). An optical pumping agent is a substance which, when an electron at the ground state level is irradiated with circularly-polarized light and excited by light absorption to an excited state level and then returns to the ground state level, can cause the electron to transit with high probability to one of the electron levels of the rubidium ground state levels of which the degeneracy has been magnetically broken by an externally applied magnetic field to create a state of high electron spin polarization. Among such substances, rubidium, which has a high vapor pressure, is preferred since the optical pumping agent is vaporized by creating a vacuum in the cell 58 and transported in the form of vapor.

The wavelength of the laser light application system 71 depends on the type of the alkali metal to be used. When rubidium is used, the laser light application system 71 preferably has a center wavelength of 794.5 to 795.1 nm.

The output of the laser light application system 71 is determined based on the size of the cell 58 and the flow rate of the noble gas. For nuclear spin polarization of all the noble gas in the cell 58, a high output of, for example, 10 to 200 W, is preferred.

To produce a polarized noble gas, the alkali metal as an optical pumping agent is introduced into the polarized noble gas generating cell 58, and then the noble gas is introduced into the polarized noble gas generating cell 58. Then, laser light is applied to induce nuclear spin polarization.

First, the valves 51 and 52 are closed while the valves 53, 54, 55, and 56 are opened. The cell 58, the optical pumping catalyst supply line 73 and the catalyst reservoir 59 are then evacuated with the ultrahigh vacuum evacuation system 57 to create a vacuum therein. The heating device 60 is then operated so that the catalyst in the catalyst reservoir 59 is transported into the cell 58 through the optical pumping catalyst supply line 73. The heating device 60 is then stopped to cool the catalyst to room temperature. Then, the valves 54 and 55 are closed and the valve 52 is opened to introduce high-purity nitrogen gas. When it is determined by the vacuum gauge 61 that the pressure of the high-purity nitrogen gas has reached atmospheric pressure, the valves 52 and 53 are closed. The unit composed of the cell 58, the first and second valves 53 and 51, and their associated pipes is separated by the separation mechanisms 62 and 63 from a unit composed of the catalyst reservoir 59, the vacuum gauge 61, the vacuum evacuation system 57 and their associated valves and pipes including the optical pumping catalyst supply line 73.

Then, the second valve 51 is connected to the extra fine capillary tube 64 by the separation mechanism 62 while the first valve 53 is connected to the noble gas introduction line 65 by the separation mechanism 63. After the valve 66 is closed and the valve 67 is opened, the noble gas introduction line 65 is evacuated with the ultrahigh vacuum evacuation device 68 to create a vacuum therein. When it is determined by the vacuum gauge 69 that sufficient evacuation has been accomplished, the valve 67 is closed and the valve 66 is opened to introduce the high-purity noble gas. When it is determined by the vacuum gauge 69 that the pressure of the high-purity noble gas has reached atmospheric pressure, the first valve 53 is opened to introduce the noble gas into the cell 58. After heating the cell 58 with the heating device 70, laser light is emitted from the laser light application system 71. At the same time, a uniform magnetic field is applied to the cell 58 by the magnetic field application system 72. When the second valve 51 is opened, a nuclear spin-polarized noble gas can be delivered through the extra fine capillary tube 64.

When the flow rate of the noble gas is 5 to 100 sccm, the nuclear spin-polarized noble gas can be supplied to the magnetic resonance imager 1 at a rate generally the same as the rate at which the nuclear spin-polarized noble gas is produced in the cell 58. Therefore, the nuclear spin-polarized noble gas does not unnecessarily remain in the cell 58 and occurrence of spin relaxation caused by collisions of the nuclear spin-polarized noble gas with inner walls of the cell 58 can be prevented. In addition, since the nuclear spin-polarized noble gas can be supplied in the form of a laminar flow through the extra fine capillary tube 64, occurrence of spin relaxation caused by collisions of the nuclear spin-polarized noble gas with the inner wall of the extra fine capillary tube 64 can be also prevented.

In the above-described embodiment, the first valve 53 and the gas introduction conduit 103 are commonly used both for supplying the pumping catalyst and for feeding the noble gas to the reaction chamber 108 of the cell 58. If desired, however, the first valve 53 and the gas introduction conduit 103 are used solely for feeding the noble gas. In such a case, although not shown, an optical pumping catalyst supply line can be connected to extend between the reaction chamber 108 and the pumping catalyst reservoir 59 through a suitable valve for supplying the optical pumping catalyst to from the reservoir 59 to the reaction chamber 108 through the valve.

Then, the generated nuclear spin-polarized noble gas is supplied through the extra fine capillary tube 64 to the nuclear magnetic resonance spectrometer 1 and the NMR signal intensity is measured.

The following example will further illustrate the present invention.

Example 1

Using extra fine capillary tubes made of fused silica and having an inside diameter of 0.53 mm and a length of 2 m (fused silica capillary tubes manufactured by GL Science, Ltd.), the NMR signal intensity was measured at nuclear spin polarized xenon gas flow rates of 5, 10, 15, 20, 25 and 30 sccm.

A cell as described before was used. Xenon gas (manufactured by Taiyo Nippon Sanso Corporation, purity: 99.995%) was introduced into the cell 58, and irradiated with light having a wavelength of 794.7 nm, a half width 0.5 nm, and an output of 27 W using laser diodes (manufactured by PD-LD Inc.). A magnetic field with an intensity of $1.25 \times 10^{-2}$ T was applied to the cell 58 using two ring-shaped permanent magnets (manufactured by Magna Co., Ltd.). The temperature of the cell 58 was set at 200° C.

The intensities of the NMR signals were measured using a pulsed NMR spectrometer (manufactured by Thamway Co., Ltd.). The measurement conditions were a magnetic field intensity of 0.3 T, and a frequency of 3.574 MHz. An FID after a single pulse was obtained. In the relationship between the nuclear spin polarized xenon gas flow rate and the NMR signal intensity, the NMR signal intensity exhibited a maximum value when the flow rate was about 20 sccm. The maximum production rate of the nuclear spin-polarized noble gas in the cell 58 appears to correspond to about 20 sccm. A glass tube having the same size as the glass tube used in an experiment of nuclear spin polarized xenon was filled with water with a known magnetic susceptibility, and a signal obtained when the glass tube was inserted into a detector was measured and used as a reference for calculation of the polarization rate. The ratio of the magnitudes of spin magnetization contributing to the signals of proton under a thermal equilibrium condition and $^{129}$Xe with a polarization rate of 100% is 1:10000. Using the relationship, the polarization rate of $^{129}$Xe can be estimated from the NMR signal intensity obtained in an experiment using the gyromagnetic ratio between proton and $^{129}$Xe and water and nuclear spin polarized xenon of the same volume. The maximum value of the polarization rate of $^{129}$Xe obtained from the signal intensity and the NMR signal intensity obtained using the same volume of water was 8%.

The nuclear magnetic resonance spectrometer and the nuclear magnetic resonance imager using the nuclear spin-polarized noble gas according to the present invention can be used for diagnosis of respiratory organs or brain of humans or animals.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description, and all the changes which come within the meaning and range of equivalency of the claims are therefore intended to be embraced therein.

What is claimed is:

1. An apparatus for producing a nuclear spin-polarized noble gas by spin-polarizing a noble gas in the presence of an optical pumping catalyst, comprising:
    a cell comprising first and second surface members spaced apart from each other to define a reaction chamber therebetween, one of said first and second surface members being configured to allow laser light to pass therethrough into said reaction chamber,
    a gas introduction conduit connected in fluid communication with said reaction chamber for feeding the noble gas therethrough to said reaction chamber,
    a gas discharge conduit connected in fluid communication with said reaction chamber,
    a system for applying a magnetic field to said reaction chamber,
    a system for delivering laser light to said reaction chamber through one of said first and second surface members that is configured to allow laser light to pass therethrough into said reaction chamber,
    a noble gas introduction line for feeding the noble gas,
    a first valve having an outlet port connected to said gas introduction conduit and an inlet port adapted to be in fluid communication with said noble gas introduction line,
    a second valve having an inlet port connected to said gas discharge conduit and an outlet port, and
    a capillary tube removably connected to said outlet port of said second valve for recovering a nuclear spin-polarized noble gas produced in said reaction chamber.

2. An apparatus according to claim 1, further comprising an optical pumping catalyst supply line detachably connected to said inlet port of said first valve for supplying the optical pumping catalyst to said reaction chamber through said first valve.

3. An apparatus according to claim 1, further comprising an optical pumping catalyst supply line connected in fluid communication with said reaction chamber through a valve means for supplying the optical pumping catalyst to said reaction chamber through said valve means.

4. An apparatus according to claim 1, wherein each of said first and second valves has a structure such that the outlet port thereof can be seen from the inlet port thereof when said valve is opened.

5. An apparatus according to claim 1, wherein each of said first and second valves is a gate valve.

6. An apparatus according to claim 1, wherein said cell comprises a fastener for detachably integrating said first and second surface members, wherein said first surface member is configured to allow laser light to pass therethrough into said reaction chamber, and wherein each of said gas introduction conduit and gas discharge conduit is connected to said second surface member and opens into said reaction chamber.

7. An apparatus according to claim 6, further comprising a catalyst reservoir for containing the optical pumping catalyst, and an optical pumping catalyst introduction line extending between said catalyst reservoir and said inlet port of said first valve for supplying the optical pumping catalyst to said reaction chamber through said first valve, wherein said first surface member has an interior surface configured to receive deposits of the optical pumping catalyst supplied from said catalyst reservoir into said reaction chamber.

8. An apparatus according to claim 6, further comprising a catalyst reservoir for containing the optical pumping catalyst, and an optical pumping catalyst introduction line extending between said catalyst reservoir and said reaction chamber via valve means for supplying the optical pumping catalyst to said reaction chamber through said valve means, wherein said first surface member has an interior surface configured to receive deposits of the optical pumping catalyst supplied from said catalyst reservoir into said reaction chamber.

9. An apparatus according to claim 6, wherein each of said first and second surface members has a flat surface.

10. An apparatus according to claim 9, wherein said flat surfaces of said first and second surface members are disposed faced to face in parallel with each other.

11. An apparatus according to claim 10, wherein each of said gas introduction conduit and gas discharge conduit is oriented substantially normal to the flat surfaces of said first and second surface members.

12. An apparatus according to claim 1, wherein said first and second surface members are spaced a distance of 0.3 to 2 mm from each other.

13. An apparatus according to claim 1, wherein said capillary tube has an inside diameter of 0.1 to 1.25 mm.

14. A nuclear magnetic resonance spectrometer connected to an apparatus according to claim 1 and adapted for using the nuclear spin-polarized noble gas produced by said apparatus.

15. A nuclear magnetic resonance imager connected to an apparatus according to claim 1 and adapted for using the nuclear spin-polarized noble gas generated by said apparatus.

16. An apparatus for producing a nuclear spin-polarized noble gas, comprising:
- a flat cell including flat plates opposed to each other with a gap in which a noble gas is spin polarized in the presence of an optical pumping catalyst,
- a laser beam delivering system for applying a laser beam as an excitation light into said gap,
- a magnetic field applying system for applying a magnetic field such that the lines of magnetic force pass through said flat plates into said gap in a direction perpendicular or generally perpendicular thereto,
- a device for adjusting the temperature of the flat cell, and
- an extra fine capillary tube,
- wherein at least one of said flat plates of said flat cell is configured to allow laser light to pass therethrough into said gap,
- wherein said flat cell is provided with a gas introduction conduit for introducing a noble gas, and a discharge conduit for discharging generated nuclear spin-polarized noble gas,
- wherein the introduction and cut-off of the noble gas to said gas introduction conduit are controlled by a first valve having such a structure that an outlet port thereof can be seen from an inlet port thereof when said valve is opened, and
- wherein the discharge and cut-off of generated nuclear spin-polarized noble gas from said discharge conduit is controlled by a second valve having such a structure that an outlet port thereof can be seen from an inlet port thereof when said valve is opened, and
- wherein said extra fine capillary tube is removably connected to said outlet port of said second valve.

* * * * *